United States Patent [19]
Eaton

[11] Patent Number: 5,930,893
[45] Date of Patent: Aug. 3, 1999

[54] THERMALLY CONDUCTIVE MATERIAL AND METHOD OF USING THE SAME

[76] Inventor: Manford L. Eaton, 5020 W. 178th Ter., Stilwell, Kans. 66085

[21] Appl. No.: 08/654,701

[22] Filed: May 29, 1996

[51] Int. Cl.$^6$ ........................................................ F28F 7/00
[52] U.S. Cl. ........................ 29/890.03; 165/185; 361/704
[58] Field of Search ................................... 165/185, 133, 165/905; 361/704, 705, 707, 708; 29/890.03

[56] References Cited

U.S. PATENT DOCUMENTS

| | | | |
|---|---|---|---|
| 4,193,445 | 3/1980 | Chu et al. ............................. | 165/185 X |
| 4,299,715 | 11/1981 | Whitfield et al. .................... | 165/185 X |
| 4,304,294 | 12/1981 | Reisman et al. ..................... | 165/185 X |
| 4,466,483 | 8/1984 | Whitfield et al. . | |
| 4,471,837 | 9/1984 | Larson .................................... | 165/185 |
| 4,473,113 | 9/1984 | Whitfield et al. . | |
| 4,762,174 | 8/1988 | Artus . | |
| 4,882,654 | 11/1989 | Nelson et al. ........................... | 361/704 |
| 5,168,348 | 12/1992 | Chu et al. ............................ | 361/704 X |

OTHER PUBLICATIONS

DuPont brochure: "Ethylene–Vinyl Acetate Copolymer Resins Safety in Handling and Use", Date Unknown.
DuPont brochure: "Elvax 300 Series Resins", Date Unknown.
DuPont brochure: "Elvax 200 Series Resins", Date Unknown.
J. appl. Chem. Biotechnol. 1974, 24, 81–91, Fischer–Tropsch Waxes, The Thermal Conductivity of Hard Wax.
"Fischer–Tropsch Waxes . . . Their production, properties and uses" by Charles J. Marsel, presented at C.S.M.A. meeting, Dec. 7, 1984.
DuPont brochure: "Elvax Resins for Molding, Compounding and Extrusion, a Grade Selection Guide", May 1985.

*Primary Examiner*—Leonard Leo
*Attorney, Agent, or Firm*—Chase & Yakimo, L.C.

[57] ABSTRACT

A method for establishing a thermal interface between an electrical component and a heat sink including the selection of a compound having a melt temperature above the normal operating temperature of the component. The compound may be placed on a carrier gasket or the like for insertion between the component and the heat sink. Upon initial heat up of the component, the component heats beyond its normal operating temperature due to an inefficient thermal joint among the component, solidified compound and heat sink. The electrical component initially reaches an initial operating temperature sufficient to cause the compound to deform or melt and fill the spaces between the mating surfaces of the component and heat sink. Once the compound resolidifies, a thermal joint is permanently established which precludes the component from heating beyond its normal operating temperature upon subsequent operation. As the normal operating temperature of the component is below the melt point of the compound, the compound will remain in a solid state. The compound is selected so as to deform only during initial component operation so as to avoid the problems of liquification, including the mess associated with silicon greases, the decrease in conductivity of a compound when liquified and the tendency of a liquified compound to flow away from the thermal joint.

16 Claims, 3 Drawing Sheets

ILLUSTRATION OF THERMAL INTERFACE BARRIERS BETWEEN SEMICONDUCTOR AND THERMAL COMPOUND AND BETWEEN THERMAL COMPOUND AND HEATSINK BEFORE THE MATERIAL HAS BEEN DEFORMED AND/OR FLOWED INTO THE INTERSTICES.

"NOMINALLY MATING SURFACES" SHOWING HOW COMPOUND FILLS THE INTERSTICES.

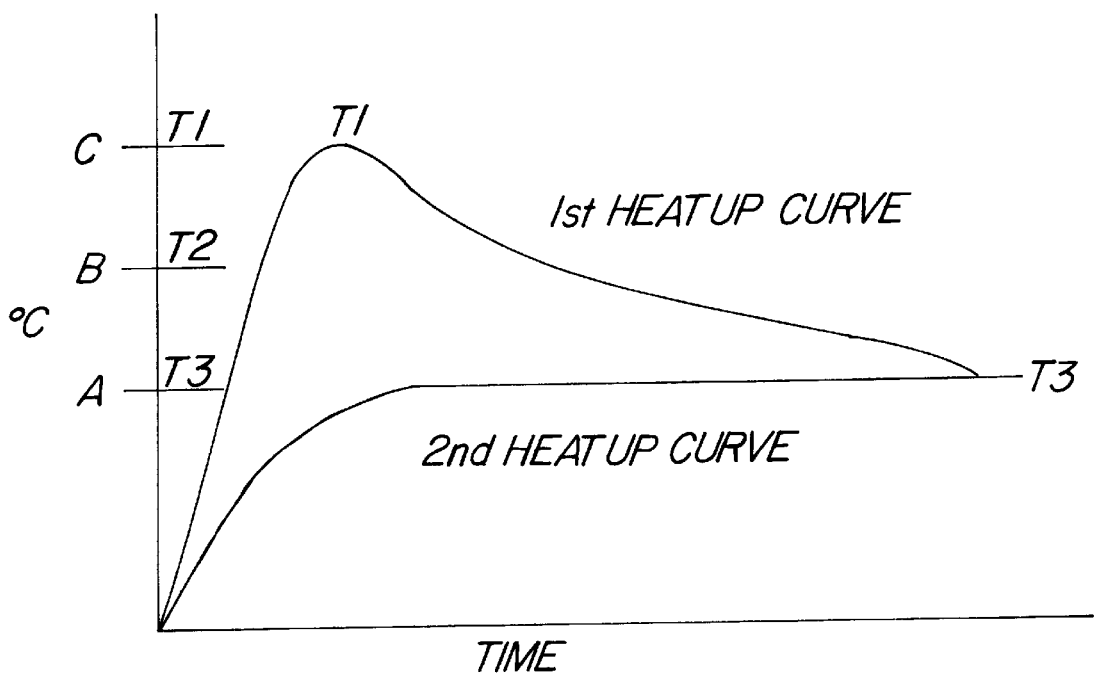

THERMALLY CONDUCTIVE MATERIAL AND METHOD OF USING THE SAME

BACKGROUND OF THE INVENTION

This invention relates to a thermally conductive compound and method of constructing a low impedance, thermal interface/joint between an electronic component and a heat sink.

Electrical components, such as semiconductors, transistors, etc., optimally operate at a pre-designed temperature which ideally approximates the temperature of the surrounding air. However, the operation of electrical components generates heat which, if not removed, will cause the component to operate at temperatures significantly higher than its normal operating temperature. Such excessive temperatures can adversely affect the optimal operating characteristics of the component and the operation of the associated device.

To avoid such adverse operating characteristics, the heat should be removed, one such method being a conduction of the heat from the operating component to a heat sink. The heat sink can then be cooled by conventional convection and/or radiation techniques. During conduction, the heat must pass from the operating component to the heat sink either by surface contact between the component and the heat sink or by contact of the component and heat sink surfaces with an intermediate medium. In some cases, an electrical insulator must be placed between the component and heat sink. Thus, a heat conducting path must be established between the component and the heat sink surfaces with or without an electrical insulator therebetween.

The lower the thermal impedance of this heat conducting path the greater the conductivity of heat from the component to the heat sink. This impedance depends upon the length of the thermal path between the component and heat sink as well as the degree of effective surface area contact therebetween.

As the surfaces of the heat sink and component are not perfectly flat and/or smooth, a full contact of the facing/mating surfaces is not possible. Air spaces, which are poor thermal conductors, will appear between these irregular mating surfaces and thus increase the path's impedance to conduction. It is thus desirable to remove these spaces by utilizing a heat conducting medium, the medium designed to contact the mating surfaces and fill the resulting air spaces. The removal of these air spaces lowers the path's thermal impedance and increases the path's thermal conductivity. Thus, the conduct of heat along the thermal path is enhanced.

Mica insulators with silicon grease thereon, the silicon grease containing "heat conducting particles," such as a metallic oxide, have been inserted between the component and heat sink to establish a thermal path. The grease can also be applied directly to the mating surfaces in an attempt to fill the resulting voids therebetween. However, the non-soluble grease is messy and can contaminate the equipment, clothing and personnel.

Another proposed solution was to coat a polymeric insulating gasket with a metallic oxide thereon, the gasket being inserted between the component and heat sink during assembly. Such oxides can be expensive, toxic and adhesion to the gasket can be difficult. Moreover, the gasket may not fully mesh with the irregular mating surfaces of the component and heat sink resulting in undesirable, inefficient air spaces therebetween.

The use of a compound comprising a paraffin wax with a softener such as petroleum jelly as the intermediate medium has been proposed in the Whitfield patents U.S. Pat. Nos. 4,299,715, 4,473,113, 4,466,483. The softener is intended to make the compound less brittle so it will not crack when coated onto the intermediate flexible insulator. However, this compound changes from a solid to a liquid state at the component's normal operating temperature which decreases its thermal conductivity. Also, the compound tends to flow away from the thermal path/joint which increases the impedance of the thermal path. Moreover, this flow can contaminate the surrounding surfaces.

Also, the use of softeners makes the resulting compound more susceptible to abrasion or chemical solvents. Thus, the compound can be rubbed off its substrate carrier during handling or component cleaning. Also, the "blocking temperature" of the compound is lowered, i.e. the temperature at which the coated carriers will stick to each other. (If the blocking temperature is equal to or lower than the room temperature, the coated carriers will stick to each other.) Also, the softeners makes the compound stickier which makes it difficult to manipulate and susceptible to collection of foreign matters thereon. Such foreign materials can lead to component malfunctions, if not failure.

In response thereto I have invented a method of selecting a compound for establishing an efficient thermal joint between the surfaces of an electrical component and heat sink. With cognizance of a normal operating temperature of a selected component, the compound is selected to melt only during initial component operation by a component temperature well above the component's normal operating temperature. Once initially liquified or sufficiently deformable, the clamping pressure of the component to the heat sink causes the compound to fill the spaces resulting in the thermal path between the heat sink and the component. This action presents a thermal path of low impedance which initiates an effective conduct of the heat from the component to the heat sink. The component temperature then falls to a temperature below the compound melt temperature and to its normal operating temperature which causes the compound to resolidify. Upon subsequent operation of the component, the component reaches only the component's normal operating temperature as the previously established compound joint formed during initial component operation remains in a solid state. As the compound does not melt during subsequent component operation, a higher thermal conductivity is maintained. Moreover, as compounds of high molecular weight can be used in the above process, a higher thermal conductivity will result with or without the use of heat conductivity particles.

It is therefore a general object of this invention to provide an improved compound and method of selecting the same for reducing the impedance to heat flow through a thermal joint established between an electrical component and a heat sink.

Another object of this invention is to provide a compound and method, as aforesaid, which is initially liquified/deformable during initial component operation but remains in a solid state during subsequent component use.

A further object of this invention is to provide a compound and method, as aforesaid, wherein the compound does not melt at a subsequent normal operating temperature of the component.

A more particular object of this invention is to provide a compound, as aforesaid, which is easily coated onto a substrate carrier for placement between the component and heat sink.

Another object of this invention is to provide a compound and method, as aforesaid, which provides a high thermal conductivity relative to previous compounds utilizing material softeners.

A further object of this invention is to provide a compound, as aforesaid, which is easy to manipulate and does not contaminate surrounding personnel and equipment.

Another particular object of this invention is to provide a compound, as aforesaid, which includes a material therein so as to avoid the problems associated with material softeners.

Other objects and advantages of this invention will become apparent from the following description taken in connection with the accompanying drawings, wherein is set forth by way of illustration and example, an embodiment of this invention.

BRIEF DESCRIPTION OF THE DRAWINGS

FIG. 4 illustrates first and second time/temperature curves of an electrical component in connection with using the selected thermally conductive material.

DESCRIPTION OF THE PREFERRED EMBODIMENT

Figure 1:
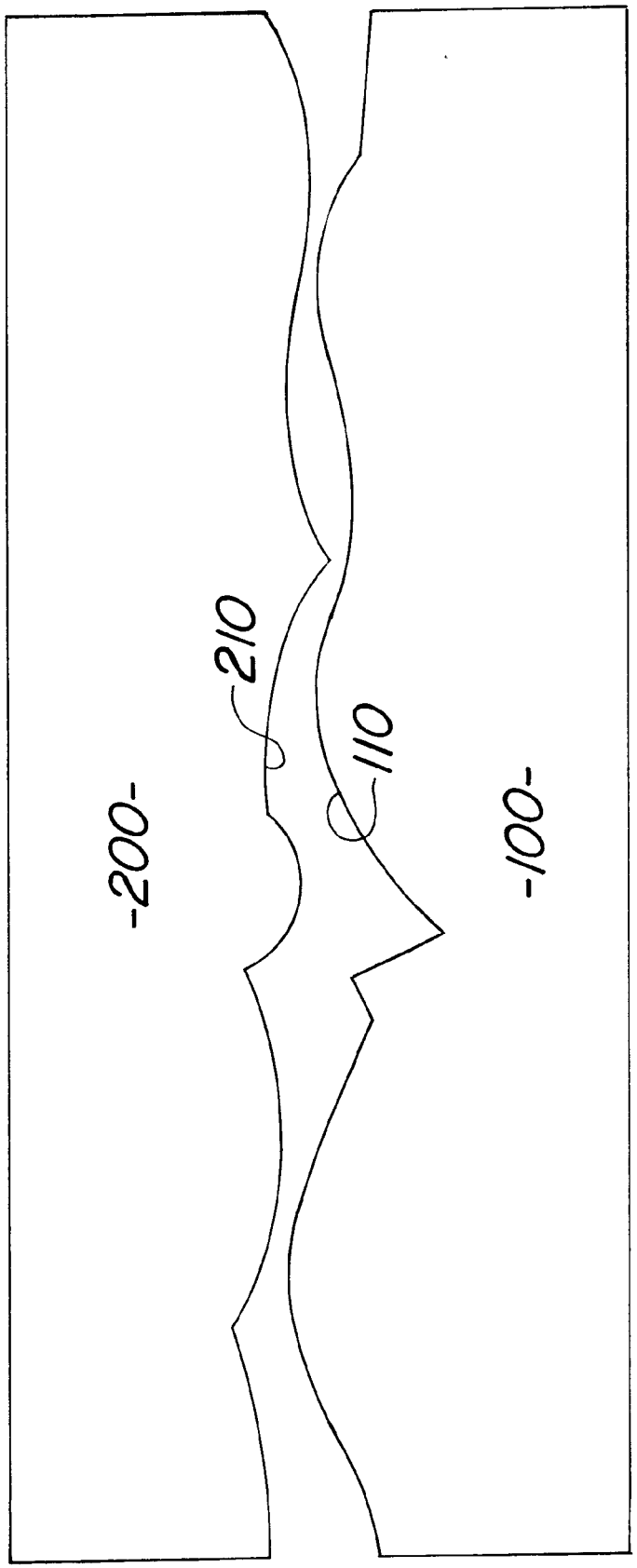
FIG. 1 is a diagrammatic view of the irregularities of the mating surfaces of an electrical component and a heat sink.

Turning more particularly to the drawings, FIG. 1 diagrammatically shows a surface 210 of an electrical component 200, e.g. as a transistor, semiconductor, etc., facing a heat sink 100 surface 110. It is understood that such surfaces 110, 210 are not smooth, such irregularities being diagrammatically shown. Upon mating the surfaces 110, 210, air spaces will appear between these irregular surfaces. As air is a poor conductor of heat, it is desirable to fill these resulting voids with a heat conducting medium so as to lower the impedance of the thermal joint/path 1000 established between the component 200 and heat sink 100. The lower the impedance of the thermal path the more efficient the conduct of heat from component 200 to heat sink 100.

Figure 2:
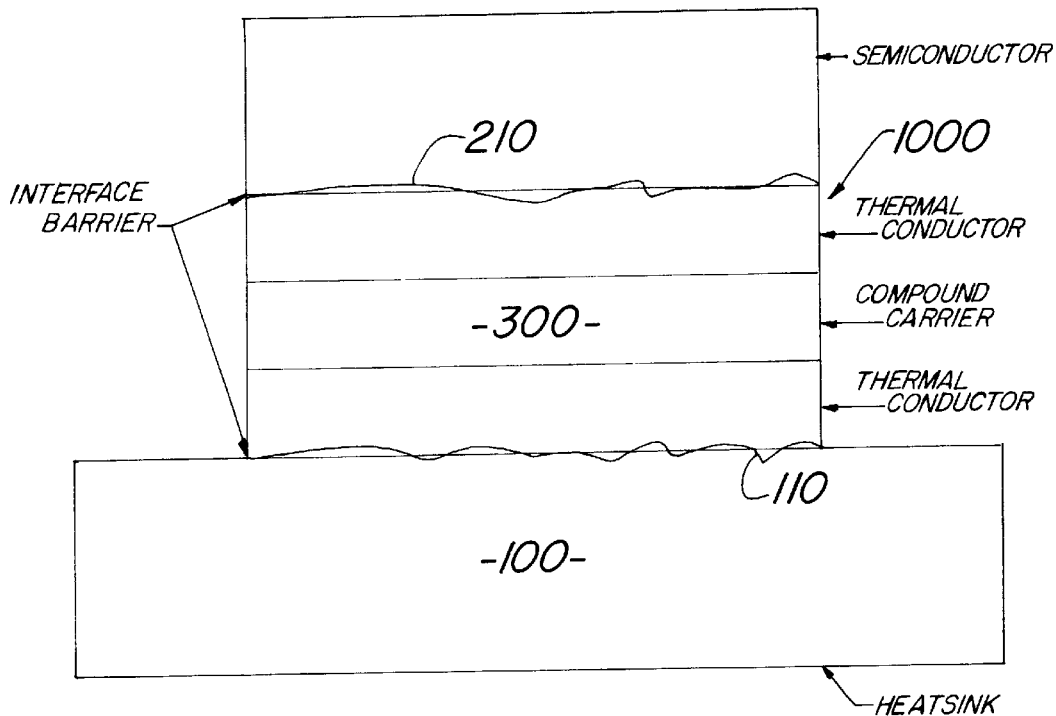
FIG. 2 is a diagrammatic view, on an enlarged scale, of a semiconductor and a heat sink with a compound coated on an intermediate carrier substrate.
Figure 3:
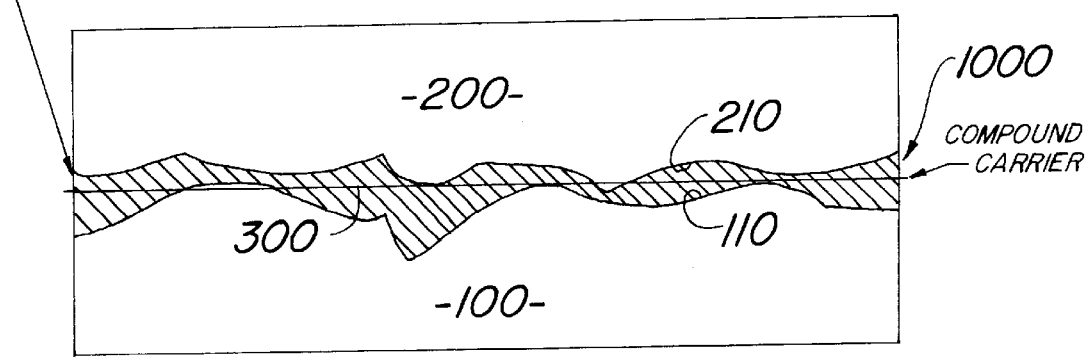
FIG. 3 is a diagrammatic view showing the compound, as coated on a carrier substrate, the substrate being positioned between the mating surfaces of an electrical component and heat sink.

FIG. 2 shows a compound carrier in the form of a flexible gasket 300 which may act as an electrical insulator between surfaces 110, 210. The gasket 300 may also be embedded with metallic oxide/heat conducting particles so as to enhance the heat conductivity along the thermal path 1000. However, as the gasket 300 alone may not fill all the air spaces appearing between the irregular mating surfaces 110, 210, the gasket 300 can act as a substrate carrier for a compound designed to fill these resulting air spaces.

I have devised a method of selecting a compound which can either be coated onto the facing surfaces of the component 200 or heat sink 100 or onto opposed surfaces of an intermediate carrier substrate 300 so as to optimally fill the resulting air spaces and present an efficient thermal joint between the component 200 and the heat sink 100.

The compound is selected so that it can be coated onto a substrate 300 and inserted between the component 200 and heat sink 100 during assembly. As the compound is initially in a solid state, it does not fill all the resulting voids between the mating surfaces 110, 210. Thus, during initial component 200 operation, the thermal path is an inefficient one. This inefficiency causes the component 200 to reach a temperature above its normal operating temperature as well as the melt temperature of the chosen compound. The operating component 200 will thus heat the compound to its melt temperature causing the compound to liquify or deform and fill the voids between the nominally mating surfaces 110, 210 of the component 200 and the heat sink 100. Once the voids are so filled an efficient thermal joint 1000 is established which enhances the conductivity along the thermal joint 1000. In turn, more heat flows from the component 200 to the heat sink 100 such that the component temperature is reduced to its normal operating temperature. During this component cool down, the compound temperature drops below its melt temperature which returns the compound to its solid state, the previously established joint 1000 being maintained.

Upon subsequent operation of the electrical component 200 the component 200 will heat only to its normal operating temperature as the previously established thermal joint 1000 conducts heat from component 200 to heat sink 100. The compound will not liquify/deform as the normal operating temperature of the component 200 remains below the compound's melt temperature. As the compound cannot liquify, it maintains a higher thermal conductivity relative to the conductivity of its liquid state. Moreover, as the compound will not flow away from the thermal joint the joint integrity is maintained.

Utilizing the above principles various compounds can be selected so as to achieve an efficient thermal joint 1000.

As a first example, a compound comprises 95 parts of a paraffin wax having a 123.4° F. melting point. To this paraffin I add five parts by weight a 28% ethylene/vinyl acetate copolymer hardened with a 74° C. melting point. One such copolymer is an Elvax resin available from the Dupont Company, Polymer Products Division of Wilmington, Del. The element proportions are selected so that the resulting compound will have a melt temperature above the normal operating temperature of the component. Upon heating the compound to a temperature beyond its melt temperature, i.e. approximately 52° C., the viscosity of the compound will decrease so that a carrier 300 can be dip coated into the compound.

The carrier can be a 0.002 inch thick polymer insulating material with or without heat conducting materials impregnated therein. The compound resolidifies into a thin layer about 0.001 inch thick on the opposed surfaces of the polyamide carrier 300.

When the temperature of the electrical component reaches 80° C., the compound is heated beyond its melt temperature, i.e. 52° C., so as to fill the empty spaces appearing between the heat sink 100 and component 200 surfaces. This compound action will reduce the thermal impedance of the thermal joint 1000 between the component 200 and heat sink 100 such that the component 200 will eventually return to its normal operating temperature. (The thermal impedance of this compound is approximately 0.179 C/W.) As the component must initially operate beyond the compound melt temperature so as to heat the compound to its melt temperature, it is understood that by choosing a wax and copolymer with specific melt temperatures, the melt temperature of the resulting compound can be varied between 20° C. and 100° C. and chosen according to the initial and normal operating temperatures of the component.

FIG. 4 diagrammatically relates the temperatures of the component 200 to the melt temperature of the compound. As shown in FIG. 4, the first heat up curve 900 of the component 200 shows the component reaching a maximum temperature at T1. Upon reaching this temperature, the compound will be heated beyond its melt temperature T2 so as to become sufficiently deformable to fill the spaces between the component surface 210 and heat sink surface 110. Upon these spaces being filled, the thermal impedance of the path between the component and the heat sink is reduced which reduces the temperature of the component 200 to the desired component operating temperature T3, this temperature being below the chosen compound melt temperature T2.

Upon a subsequent operation of the component 200, the curve 950 shows the temperature of the component 200 reaching a maximum of T3, the component's normal operating temperature. As the temperature of the component 200 will not increase beyond T3, due to the previously established efficient thermal joint 1000, the component temperature T3 remains below the compound melt temperature T2. Thus the compound will remain in a solid state during normal operation of the component, it being understood that the compound will have a higher conductivity than when in a liquid state. Thus, a more efficient conduct of heat through thermal joint 1000 will occur as compared to the prior art in which the compound is designed to liquify.

Moreover, as the resulting compound will remain in a generally solid state at the normal operating temperatures of the component 200 and not phase into a liquid state the problems with the prior art have also been addressed, e.g. the elimination of the messy liquids and a compound flow away from the thermal joint.

It is also noted that as the initial heat up curve allows the component to heat beyond its normal operating temperature, compounds having high melt temperatures can be used. Thus, compounds having high molecular weights can be used, it being understood that such compounds have a better conductivity as opposed to compounds of lower molecular weight.

For example, a synthetic wax having a melt point of 100° C. and a molecular weight of approximately 1000 can be used, the wax being a type of wax known as a Fischer-Tropsch wax. The wax was coated onto a carrier 300 as above described. Upon initial operation of a semiconductor the semiconductor reached a temperature of 105° C. which melted the wax. Upon the wax establishing the thermal joint the temperature of the semiconductor fell to 82° C. The thermal conductivity of the wax at 150° C. is 0.191 W/mK while at 82° C. is 0.242 W/mK. As the compound will not reach its melt temperature during subsequent use, the thermal conductivity of the joint 1000 will be greater than if the compound is liquified as found in the prior art.

Accordingly, it is desirable to have the electrical component initially heat to a temperature considerably above its normal operating temperature so as to melt the compound. Thus, the addition of the Elvax to the wax or the use of a wax of a high molecular weight can be used which results in a material which initially presents an inefficient thermal joint. (It is noted that the compound should also be relatively hard and undeformable by the normal mounting/clamping forces utilized in mounting the component to the heat sink.) This inefficient thermal joint allows the component 200 to heat to a temperature which will melt the component so as to establish a thermal joint between the component 200 and heat sink 100. This joint will reduce the component temperature and allow the compound to resolidify. Due to this joint 1000 presence, the component 200 will not reach a temperature to subsequently melt the compound. Thus, the integrity of joint 1000 is maintained. Moreover, the use of the Elvax hardener in the compound or use of a medium of high molecular weight solves the problems associated with the prior art.

Although the above has been discussed without the use of any heat conducting particles in the compound or barrier, it is also understood that heat conducting particles may also be used which may further decrease the thermal impedance of the thermal joint/path.

It is to be understood that while certain forms of this invention have been illustrated and described, it is not limited thereto except insofar as such limitations are included in the following claims and allowable functional equivalents thereof.

Having thus described the invention, what is claimed as new and desired to be secured by Letters Patent is as follows:

1. A method of establishing a thermal joint for conduct of heat between an electrical component and a heat sink, the electrical component having a normal operating temperature comprising the steps of:

choosing a compound having a melt temperature above a normal operating temperature of an electrical component;

inserting the compound between the component and a heat sink;

initially operating the component to an initial temperature above the normal operating temperature and above said compound melt temperature, the component heating said compound to at least said compound melt temperature, the compound thereat flowing into air spaces between the component and associated heat sink to establish a thermal joint therebetween;

operating the component until it reaches a normal operating temperature below said melt temperature to return said compound to a solid state, a subsequent operation of the component heating the component to only said normal operating temperature due to said thermal joint established between the component and heat sink, said compound in said joint remaining in said solid state.

2. The method as claimed in claim 1 wherein said compound comprises:

a material having solid and liquid phases, said liquid phase occurring at said melt temperature above the normal operating temperature of the component and below said initial temperature achieved by said initial operation of the component.

3. The method as claimed in claim 1 wherein said inserting step includes the step of positioning the compound on opposed surfaces of a substrate, said substrate inserted between the component and heat sink prior to said initial operation of the component.

4. The method as claimed in claim 3 wherein said substrate electrically isolates the component from the heat sink.

5. The method as claimed in claim 1 wherein the compound comprises a paraffin and copolymer hardener, the resulting melt point of said compound corresponding to said compound melt temperature.

6. The method as claimed in claim 1 wherein said compound comprises a synthetic wax of a molecular weight wherein the melt temperature of said synthetic wax corresponds to said compound melt temperature.

7. A method of establishing a thermal joint for conduct of heat between an electrical component and a heat sink, the electrical component having a normal operating temperature comprising the steps of:

choosing a compound having a melt temperature above a normal operating temperature of an electrical component;

clamping a solidified form of the compound between opposing surfaces of the component and a heat sink;

initially operating the component to an initial temperature above said melt temperature to cause the compound to deform so as to fully contact said opposing surfaces of the component and heat sink;

continuing said operation of the component until it reaches a temperature to allow said compound to return to a solid state, a subsequent operation of the component heating the component to only said normal operating temperature due to said compound between the component and heat sink remaining in said solid state.

8. The method as claimed in claim 7 wherein said compound comprises:

a material having solid and deformable phases, said deformable phase occurring at said initial component temperature.

9. The method as claimed in claim 7 further comprising the stop of positioning said compound on opposed surfaces of a substrate, said substrate inserted between the component and heat sink prior to said clamping step.

10. The method as claimed in claim 9 wherein said substrate electrically isolates the component from the heat sink.

11. The method as claimed in claim 7 wherein the compound is a combination of paraffin and a paraffin hardener, the resulting melt point of said compound being reached upon said component reaching said initial component temperature.

12. The method as claimed in claim 7 wherein said compound is a synthetic wax of a molecular weight wherein the melt temperature of said synthetic wax is reached upon said initial operation of said component to said initial temperature.

13. A method of establishing a thermal joint for conduct of heat between an electrical component and a heat sink, the electrical component having a normal operating temperature comprising the steps of:

choosing a compound having a melt temperature above a normal operating temperature of an electrical component;

inserting the compound between the component and a heat sink;

operating the component for initially heating the compound to at least said compound melt temperature, the compound at said melt temperature flowing into air spaces between the component and associated heat sink to establish a thermal joint therebetween;

allowing the compound to return to a solid state, a subsequent operation of the component heating the component to only said normal operating temperature due to said thermal joint established between the component and heat sink, said compound in said joint remaining below said melt temperature in said solid state whereby to retain said established thermal joint.

14. The method as claimed in claim 13 wherein said inserting step includes the step of positioning the compound on opposed surfaces of a substrate, said substrate inserted between the component and heat sink prior to an initial operation of the component.

15. A method of establishing a thermal joint for conduct of heat between an electrical component and a heat sink, the electrical component having a normal operating temperature comprising the steps of:

choosing a compound having a melt temperature above a normal operating temperature of an electrical component;

clamping a solidified form of the compound between opposing surfaces of a component and a heat sink;

operating the component for initially heating the compound to said melt temperature to cause the compound to deform so as to fully contact said opposing surfaces of the component and heat sink;

allowing the compound to cool to return to a solid state, a subsequent operation of the component heating the component to only said normal operating temperature due to said compound between the component and heat sink remaining below said melt temperature and in said solid state.

16. The method as claimed in claim 15 further comprising the stop of positioning said compound on opposed surfaces of a substrate, said substrate inserted between the component and heat sink prior to said clamping step.

* * * * *